(12) United States Patent
Banschick et al.

(10) Patent No.: US 8,988,418 B1
(45) Date of Patent: Mar. 24, 2015

(54) SYSTEM AND METHOD FOR PARAMETRIC DISPLAY OF MODULAR AESTHETIC DESIGNS

(75) Inventors: Kenneth Banschick, Port Washington, NY (US); Andrei Gurulev, Brooklyn, NY (US)

(73) Assignee: Florelle, Inc., New York, NY (US)

( * ) Notice: Subject to any disclaimer, the term of this patent is extended or adjusted under 35 U.S.C. 154(b) by 0 days.

(21) Appl. No.: 13/540,589

(22) Filed: Jul. 2, 2012

Related U.S. Application Data

(63) Continuation of application No. 11/969,825, filed on Jan. 4, 2008, now Pat. No. 8,212,805.

(60) Provisional application No. 60/883,595, filed on Jan. 5, 2007.

(51) Int. Cl.
*G06T 15/00* (2011.01)
*G06Q 10/10* (2012.01)

(52) U.S. Cl.
CPC .................................. *G06Q 10/101* (2013.01)
USPC ........... 345/418; 345/441; 345/589; 345/593; 705/42; 705/26.5; 705/14.36; 709/229

(58) Field of Classification Search
CPC .................................................. G06Q 10/101
USPC ................ 345/418, 441, 589, 593; 705/7, 10, 705/14.36, 26.5, 26, 42; 709/229
See application file for complete search history.

(56) References Cited

U.S. PATENT DOCUMENTS

| | | | |
|---|---|---|---|
| 3,590,434 A | 7/1971 | Watts, Jr. et al. | |
| 4,149,246 A | 4/1979 | Goldman | |
| 4,232,334 A | 11/1980 | Dyson | |
| 4,258,478 A | 3/1981 | Scott et al. | |
| 4,261,012 A | 4/1981 | Maloomian | |
| 4,297,724 A | 10/1981 | Masuda et al. | |
| 4,434,467 A | 2/1984 | Scott | |

(Continued)

FOREIGN PATENT DOCUMENTS

| WO | WO9636023 | 11/1996 |
|---|---|---|
| WO | WO9708638 | 3/1997 |

(Continued)

OTHER PUBLICATIONS

Ijiri et al, Floral Diagrams and Inflorescences: Interactive Flower Modeling using Botanical Structural Constraints; SIGGRAPH 2006, pp. 1-6, Jul. 2006.*

(Continued)

*Primary Examiner* — Phu K Nguyen
(74) *Attorney, Agent, or Firm* — Steven M. Hoffberg; Ostrolenk Faber LLP

(57) ABSTRACT

A system and method for the aesthetic design of a modular assemblage, comprising means for providing a client graphic user interface for receiving an input for defining parameters of the modular assemblage, and for presenting an image of the defined modular assemblage; communicating a code to a server representing the defined parameters; at the server, in dependence on the communicated code, defining a set of graphic elements corresponding to the defined modular assemblage; communicating the graphic elements from the server to the client; and displaying, at the client, the graphic elements received from the server to represent the defined modular assemblage.

24 Claims, 8 Drawing Sheets

(56) References Cited

U.S. PATENT DOCUMENTS

| | | |
|---|---|---|
| 4,514,178 A | 4/1985 | Noto et al. |
| 4,526,116 A | 7/1985 | Mannel |
| 4,539,585 A | 9/1985 | Spackova et al. |
| 4,546,434 A | 10/1985 | Gioello |
| 4,723,209 A | 2/1988 | Hernandez et al. |
| 4,731,743 A | 3/1988 | Blancato |
| 4,796,201 A | 1/1989 | Wake |
| 4,839,743 A | 6/1989 | Best et al. |
| 4,843,574 A | 6/1989 | Gerber |
| 4,845,636 A | 7/1989 | Walker |
| 4,849,902 A | 7/1989 | Yokoe et al. |
| 4,854,880 A | 8/1989 | Nasby |
| 4,872,056 A | 10/1989 | Hicks et al. |
| 4,873,643 A | 10/1989 | Powell et al. |
| 4,876,651 A | 10/1989 | Dawson et al. |
| 4,885,844 A | 12/1989 | Chun |
| 4,897,867 A | 1/1990 | Foster et al. |
| 4,931,929 A | 6/1990 | Sherman |
| 4,964,043 A | 10/1990 | Galvin |
| 4,991,005 A | 2/1991 | Smith |
| 5,030,117 A | 7/1991 | Delorme |
| 5,053,956 A | 10/1991 | Donald et al. |
| 5,088,052 A | 2/1992 | Spielman et al. |
| 5,111,392 A | 5/1992 | Malin |
| 5,117,354 A | 5/1992 | Long et al. |
| 5,119,188 A | 6/1992 | McCalley et al. |
| 5,122,873 A | 6/1992 | Golin |
| 5,129,719 A | 7/1992 | Dombrosky |
| 5,163,006 A | 11/1992 | Deziel |
| 5,163,007 A | 11/1992 | Slilaty |
| 5,195,030 A | 3/1993 | White |
| 5,195,092 A | 3/1993 | Wilson et al. |
| 5,197,016 A | 3/1993 | Sugimoto et al. |
| 5,204,947 A | 4/1993 | Bernstein et al. |
| 5,206,804 A | 4/1993 | Thies et al. |
| 5,214,755 A | 5/1993 | Mason |
| 5,220,420 A | 6/1993 | Hoarty et al. |
| 5,236,199 A | 8/1993 | Thompson, Jr. |
| 5,244,131 A | 9/1993 | Hollingsworth |
| 5,251,209 A | 10/1993 | Jurkevich et al. |
| 5,265,248 A | 11/1993 | Moulios et al. |
| 5,274,715 A | 12/1993 | Hsu |
| 5,274,794 A | 12/1993 | Ewing et al. |
| 5,276,789 A | 1/1994 | Besaw et al. |
| 5,283,819 A | 2/1994 | Glick et al. |
| 5,325,423 A | 6/1994 | Lewis |
| 5,339,252 A | 8/1994 | White et al. |
| 5,339,415 A | 8/1994 | Strout, II et al. |
| 5,351,276 A | 9/1994 | Doll, Jr. et al. |
| 5,355,472 A | 10/1994 | Lewis |
| 5,359,710 A | 10/1994 | Aono et al. |
| 5,363,482 A | 11/1994 | Victor et al. |
| 5,420,572 A | 5/1995 | Dolin, Jr. et al. |
| 5,420,801 A | 5/1995 | Dockter et al. |
| 5,437,032 A | 7/1995 | Wolf et al. |
| 5,438,658 A | 8/1995 | Fitzpatrick et al. |
| 5,440,479 A | 8/1995 | Hutton |
| 5,442,771 A | 8/1995 | Filepp et al. |
| 5,469,536 A | 11/1995 | Blank |
| 5,487,167 A | 1/1996 | Dinallo et al. |
| 5,495,568 A | 2/1996 | Beavin |
| 5,495,576 A | 2/1996 | Ritchey |
| RE35,184 E | 3/1996 | Walker |
| 5,504,845 A | 4/1996 | Vecchione |
| 5,508,940 A | 4/1996 | Rossmere et al. |
| 5,510,846 A | 4/1996 | Guichard et al. |
| 5,515,268 A | 5/1996 | Yoda |
| 5,517,621 A | 5/1996 | Fukui et al. |
| 5,519,435 A | 5/1996 | Anderson |
| 5,524,197 A | 6/1996 | Uya et al. |
| 5,530,652 A | 6/1996 | Croyle et al. |
| 5,530,852 A | 6/1996 | Meske, Jr. et al. |
| 5,539,677 A | 7/1996 | Smith |
| 5,550,746 A | 8/1996 | Jacobs |
| 5,550,976 A | 8/1996 | Henderson et al. |
| 5,551,021 A | 8/1996 | Harada et al. |
| 5,553,221 A | 9/1996 | Reimer et al. |
| 5,553,222 A | 9/1996 | Milne et al. |
| 5,555,496 A | 9/1996 | Tackbary et al. |
| 5,557,538 A | 9/1996 | Retter et al. |
| 5,559,714 A | 9/1996 | Banks et al. |
| 5,561,791 A | 10/1996 | Mendelson et al. |
| 5,564,001 A | 10/1996 | Lewis |
| 5,568,595 A | 10/1996 | Yosefi et al. |
| 5,570,291 A | 10/1996 | Dudle et al. |
| 5,577,180 A | 11/1996 | Reed |
| 5,577,258 A | 11/1996 | Cruz et al. |
| 5,581,783 A | 12/1996 | Ohashi |
| 5,593,072 A | 1/1997 | Hester et al. |
| 5,598,344 A | 1/1997 | Dangelo et al. |
| 5,603,043 A | 2/1997 | Taylor et al. |
| 5,608,852 A | 3/1997 | Hashimoto et al. |
| 5,611,730 A | 3/1997 | Weiss |
| 5,619,710 A | 4/1997 | Travis, Jr. et al. |
| 5,625,781 A | 4/1997 | Cline et al. |
| 5,631,974 A | 5/1997 | Lau-Kee et al. |
| 5,633,768 A | 5/1997 | Watanabe |
| 5,649,186 A | 7/1997 | Ferguson |
| 5,657,460 A | 8/1997 | Egan et al. |
| 5,680,314 A | 10/1997 | Patterson et al. |
| 5,680,528 A | 10/1997 | Korszun |
| 5,682,220 A | 10/1997 | Sherman et al. |
| 5,682,441 A | 10/1997 | Ligtenberg et al. |
| 5,683,762 A | 11/1997 | Banschick |
| 5,684,963 A | 11/1997 | Clement |
| 5,687,259 A | 11/1997 | Linford |
| 5,692,192 A | 11/1997 | Sudo |
| 5,694,551 A | 12/1997 | Doyle et al. |
| 5,701,451 A | 12/1997 | Rogers et al. |
| 5,708,838 A | 1/1998 | Robinson |
| 5,708,845 A | 1/1998 | Wistendahl et al. |
| 5,710,831 A | 1/1998 | Beernink et al. |
| 5,710,835 A | 1/1998 | Bradley |
| 5,710,918 A | 1/1998 | Lagarde et al. |
| 5,715,823 A | 2/1998 | Wood et al. |
| 5,724,522 A | 3/1998 | Kagami et al. |
| 5,729,699 A | 3/1998 | Hashimoto et al. |
| 5,729,741 A | 3/1998 | Liaguno et al. |
| 5,732,216 A | 3/1998 | Logan et al. |
| 5,737,599 A | 4/1998 | Rowe et al. |
| 5,737,619 A | 4/1998 | Judson |
| 5,737,729 A | 4/1998 | Denman |
| 5,740,801 A | 4/1998 | Branson |
| 5,742,931 A | 4/1998 | Spiegelhoff et al. |
| 5,745,681 A | 4/1998 | Levine et al. |
| 5,745,908 A | 4/1998 | Anderson et al. |
| 5,745,910 A | 4/1998 | Piersol et al. |
| 5,752,031 A | 5/1998 | Cutler et al. |
| 5,754,434 A | 5/1998 | Delfer et al. |
| 5,754,850 A | 5/1998 | Janssen |
| 5,758,110 A | 5/1998 | Boss et al. |
| 5,760,783 A | 6/1998 | Migdal et al. |
| 5,761,655 A | 6/1998 | Hoffman |
| 5,764,235 A | 6/1998 | Hunt et al. |
| 5,768,591 A | 6/1998 | Robinson |
| 5,774,670 A | 6/1998 | Montulli |
| 5,781,714 A | 7/1998 | Collins et al. |
| 5,791,992 A | 8/1998 | Crump et al. |
| 5,793,029 A | 8/1998 | Goodwin, III |
| 5,793,964 A | 8/1998 | Rogers et al. |
| 5,793,966 A | 8/1998 | Amstein et al. |
| 5,802,380 A | 9/1998 | Bangs et al. |
| 5,802,530 A | 9/1998 | Van Hoff |
| 5,806,046 A | 9/1998 | Curran et al. |
| 5,808,617 A | 9/1998 | Kenworthy et al. |
| 5,815,645 A | 9/1998 | Fredlund et al. |
| 5,819,261 A | 10/1998 | Takahashi et al. |
| 5,819,302 A | 10/1998 | Nielsen |
| 5,822,216 A | 10/1998 | Satchell, Jr. et al. |
| 5,822,436 A | 10/1998 | Rhoads |
| 5,822,511 A | 10/1998 | Kashyap et al. |
| 5,822,739 A | 10/1998 | Kara |
| 5,823,781 A | 10/1998 | Hitchcock et al. |
| 5,828,887 A | 10/1998 | Yeager et al. |

(56) References Cited

U.S. PATENT DOCUMENTS

| | | |
|---|---|---|
| 5,831,590 A | 11/1998 | Ikedo |
| 5,832,271 A | 11/1998 | Devanbu |
| 5,832,499 A | 11/1998 | Gustman |
| 5,835,911 A | 11/1998 | Nakagawa et al. |
| 5,838,991 A | 11/1998 | Shipman |
| 5,845,084 A | 12/1998 | Cordell et al. |
| 5,845,263 A | 12/1998 | Camaisa et al. |
| 5,845,279 A | 12/1998 | Garofalakis et al. |
| 5,845,299 A | 12/1998 | Arora et al. |
| 5,845,303 A | 12/1998 | Templeman |
| 5,848,291 A | 12/1998 | Milne et al. |
| 5,848,399 A | 12/1998 | Burke |
| 5,848,427 A | 12/1998 | Hyodo |
| 5,850,222 A | 12/1998 | Cone |
| 5,850,466 A | 12/1998 | Schott |
| 5,852,809 A | 12/1998 | Abel et al. |
| 5,854,850 A | 12/1998 | Linford et al. |
| 5,860,068 A | 1/1999 | Cook |
| 5,860,073 A | 1/1999 | Ferrel et al. |
| 5,861,881 A | 1/1999 | Freeman et al. |
| 5,862,325 A | 1/1999 | Reed et al. |
| 5,864,337 A | 1/1999 | Marvin |
| 5,864,851 A | 1/1999 | Breitbart et al. |
| 5,870,140 A | 2/1999 | Gillberry |
| 5,870,552 A | 2/1999 | Dozier et al. |
| 5,870,559 A | 2/1999 | Leshem et al. |
| 5,870,718 A | 2/1999 | Spector |
| 5,870,771 A | 2/1999 | Oberg |
| 5,875,108 A | 2/1999 | Hoffberg et al. |
| 5,880,740 A | 3/1999 | Halliday et al. |
| 5,880,974 A | 3/1999 | Tarumi et al. |
| 5,881,234 A | 3/1999 | Schwob |
| 5,884,029 A | 3/1999 | Brush, II et al. |
| 5,884,056 A | 3/1999 | Steele |
| 5,886,709 A | 3/1999 | Willman |
| 5,890,170 A | 3/1999 | Sidana |
| 5,890,175 A | 3/1999 | Wong et al. |
| 5,892,946 A | 4/1999 | Woster et al. |
| 5,895,454 A | 4/1999 | Harrington |
| 5,895,476 A | 4/1999 | Orr et al. |
| 5,895,477 A | 4/1999 | Orr et al. |
| 5,903,892 A | 5/1999 | Hoffert et al. |
| 5,905,973 A | 5/1999 | Yonezawa et al. |
| 5,907,617 A | 5/1999 | Ronning |
| 5,909,914 A | 6/1999 | Imai et al. |
| 5,914,713 A | 6/1999 | Nario et al. |
| 5,920,830 A | 7/1999 | Hatfield et al. |
| 5,923,324 A | 7/1999 | Berry et al. |
| 5,926,179 A | 7/1999 | Matsuda et al. |
| 5,930,769 A | 7/1999 | Rose |
| 5,930,810 A | 7/1999 | Farros et al. |
| 5,933,813 A | 8/1999 | Teicher et al. |
| 5,937,160 A | 8/1999 | Davis et al. |
| 5,937,391 A | 8/1999 | Ikeda et al. |
| 5,943,680 A | 8/1999 | Shimizu et al. |
| 5,946,665 A | 8/1999 | Suzuki et al. |
| 5,950,165 A | 9/1999 | Shaffer et al. |
| 5,950,173 A | 9/1999 | Perkowski |
| 5,956,038 A | 9/1999 | Rekimoto |
| 5,956,737 A | 9/1999 | King et al. |
| 5,968,120 A | 10/1999 | Guedalia |
| 5,970,471 A | 10/1999 | Hill |
| 5,974,400 A | 10/1999 | Kagami et al. |
| 5,974,438 A | 10/1999 | Neufeld |
| 5,978,570 A | 11/1999 | Hillis |
| 5,978,833 A | 11/1999 | Pashley et al. |
| 5,983,200 A | 11/1999 | Slotznick |
| 5,983,201 A | 11/1999 | Fay |
| 5,983,267 A | 11/1999 | Shklar et al. |
| 5,986,670 A | 11/1999 | Dries et al. |
| 5,987,480 A | 11/1999 | Donohue et al. |
| 5,991,739 A | 11/1999 | Cupps et al. |
| 5,991,781 A | 11/1999 | Nielsen |
| 5,991,792 A | 11/1999 | Nageswaran |
| 5,995,943 A | 11/1999 | Bull et al. |
| 6,002,855 A | 12/1999 | Ladner et al. |
| 6,006,235 A | 12/1999 | Macdonald et al. |
| 6,009,410 A | 12/1999 | LeMole et al. |
| 6,009,413 A | 12/1999 | Webber et al. |
| 6,009,436 A | 12/1999 | Motoyama et al. |
| 6,011,536 A | 1/2000 | Hertzmann et al. |
| 6,014,638 A | 1/2000 | Burge et al. |
| 6,016,504 A | 1/2000 | Arnold et al. |
| 6,017,157 A | 1/2000 | Garfinkle et al. |
| 6,020,884 A | 2/2000 | MacNaughton et al. |
| 6,021,218 A | 2/2000 | Capps et al. |
| 6,026,368 A | 2/2000 | Brown et al. |
| 6,026,376 A | 2/2000 | Kenney |
| 6,026,377 A | 2/2000 | Burke |
| 6,029,141 A | 2/2000 | Bezos et al. |
| 6,029,142 A | 2/2000 | Hill |
| 6,037,936 A | 3/2000 | Ellenby et al. |
| 6,047,268 A | 4/2000 | Bartoli et al. |
| 6,052,729 A | 4/2000 | Robinson |
| 6,058,417 A | 5/2000 | Hess et al. |
| 6,061,686 A | 5/2000 | Gauvin et al. |
| 6,061,710 A | 5/2000 | Eickemeyer et al. |
| 6,064,978 A | 5/2000 | Gardner et al. |
| 6,072,944 A | 6/2000 | Robinson |
| 6,076,104 A | 6/2000 | McCue |
| 6,081,906 A | 6/2000 | Nishizawa et al. |
| 6,083,267 A | 7/2000 | Motomiya et al. |
| 6,085,126 A | 7/2000 | Mellgren, III et al. |
| 6,089,424 A | 7/2000 | Colquhoun |
| 6,091,417 A | 7/2000 | Lefkowitz |
| 6,094,644 A | 7/2000 | Hillson et al. |
| 6,098,092 A | 8/2000 | Padzensky |
| 6,101,293 A | 8/2000 | McKenzie |
| 6,108,715 A | 8/2000 | Leach et al. |
| 6,125,352 A | 9/2000 | Franklin et al. |
| 6,134,392 A | 10/2000 | Gove |
| 6,134,593 A | 10/2000 | Alexander et al. |
| 6,141,446 A | 10/2000 | Boliek et al. |
| 6,141,686 A | 10/2000 | Jackowski et al. |
| 6,144,388 A | 11/2000 | Bornstein |
| 6,144,974 A | 11/2000 | Gartland |
| 6,148,336 A | 11/2000 | Thomas et al. |
| 6,154,577 A | 11/2000 | Warnick et al. |
| 6,163,536 A | 12/2000 | Dunn et al. |
| 6,167,442 A | 12/2000 | Sutherland et al. |
| 6,170,017 B1 | 1/2001 | Dias et al. |
| 6,175,879 B1 | 1/2001 | Shah et al. |
| 6,175,966 B1 | 1/2001 | Wiesenthal |
| 6,177,936 B1 | 1/2001 | Cragun |
| 6,195,101 B1 | 2/2001 | Ghislain Bossut et al. |
| 6,196,146 B1 | 3/2001 | Goldberg et al. |
| 6,212,573 B1 | 4/2001 | Lim et al. |
| 6,226,412 B1 | 5/2001 | Schwab |
| 6,230,170 B1 | 5/2001 | Zellweger et al. |
| 6,232,951 B1 | 5/2001 | Miyamoto |
| 6,236,979 B1 | 5/2001 | Kawabata |
| 6,247,010 B1 | 6/2001 | Doi et al. |
| 6,247,011 B1 | 6/2001 | Jecha et al. |
| 6,260,024 B1 | 7/2001 | Shkedy |
| 6,260,058 B1 | 7/2001 | Hoenninger et al. |
| 6,269,366 B1 | 7/2001 | Romano et al. |
| 6,272,235 B1 | 8/2001 | Bacus et al. |
| 6,281,874 B1 | 8/2001 | Sivan et al. |
| 6,285,381 B1 | 9/2001 | Sawano et al. |
| 6,285,468 B1 | 9/2001 | Cok et al. |
| 6,286,003 B1 | 9/2001 | Muta |
| 6,293,284 B1 | 9/2001 | Rigg |
| 6,301,044 B1 | 10/2001 | Huber et al. |
| 6,304,851 B1 | 10/2001 | Kmack et al. |
| 6,304,855 B1 | 10/2001 | Burke |
| 6,304,898 B1 | 10/2001 | Shiigi |
| 6,307,568 B1 | 10/2001 | Rom |
| 6,310,627 B1 | 10/2001 | Sakaguchi |
| 6,311,185 B1 | 10/2001 | Markowitz et al. |
| 6,317,192 B1 | 11/2001 | Silverbrook et al. |
| 6,317,722 B1 | 11/2001 | Jacobi et al. |
| 6,317,757 B1 | 11/2001 | Sakamaki |
| 6,321,211 B1 | 11/2001 | Dodd |
| 6,331,858 B2 | 12/2001 | Fisher |

(56) References Cited

U.S. PATENT DOCUMENTS

| | | |
|---|---|---|
| 6,336,136 B1 | 1/2002 | Harris |
| 6,339,763 B1 | 1/2002 | Divine et al. |
| 6,343,264 B1 | 1/2002 | Fenton et al. |
| 6,344,853 B1 | 2/2002 | Knight |
| 6,348,923 B2 | 2/2002 | Murata |
| 6,349,300 B1 | 2/2002 | Graf et al. |
| 6,353,770 B1 | 3/2002 | Ramsey et al. |
| 6,356,264 B1 | 3/2002 | Yasui et al. |
| 6,366,910 B1 | 4/2002 | Rajaraman et al. |
| 6,381,583 B1 | 4/2002 | Kenney |
| 6,393,135 B1 | 5/2002 | Girardi et al. |
| 6,397,230 B1 | 5/2002 | Carmel et al. |
| 6,404,426 B1 | 6/2002 | Weaver |
| 6,405,175 B1 | 6/2002 | Ng |
| 6,405,176 B1 | 6/2002 | Toohey |
| 6,414,693 B1 | 7/2002 | Berger et al. |
| 6,417,861 B1 | 7/2002 | Deering et al. |
| 6,437,782 B1 | 8/2002 | Pieragostini et al. |
| 6,449,660 B1 | 9/2002 | Berg et al. |
| 6,453,300 B2 | 9/2002 | Simpson |
| 6,456,305 B1 | 9/2002 | Qureshi et al. |
| 6,456,938 B1 | 9/2002 | Barnard |
| 6,463,445 B1 | 10/2002 | Suzuki et al. |
| 6,483,540 B1 | 11/2002 | Akasawa et al. |
| 6,483,851 B1 | 11/2002 | Neogi |
| 6,484,149 B1 | 11/2002 | Jammes et al. |
| 6,493,736 B1 | 12/2002 | Forcier |
| 6,496,849 B1 | 12/2002 | Hanson et al. |
| 6,496,856 B1 | 12/2002 | Kenner et al. |
| 6,532,312 B1 | 3/2003 | Corkran |
| 6,535,294 B1 | 3/2003 | Arledge, Jr. et al. |
| 6,535,878 B1 | 3/2003 | Guedalia et al. |
| 6,543,870 B1 | 4/2003 | Kakutani |
| 6,556,243 B1 | 4/2003 | Dotsubo et al. |
| 6,556,659 B1 | 4/2003 | Bowman-Amuah |
| 6,563,517 B1 | 5/2003 | Bhagwat et al. |
| 6,567,837 B1 | 5/2003 | Robinson |
| 6,587,118 B1 | 7/2003 | Yoneda |
| 6,589,292 B1 | 7/2003 | Langford-Wilson |
| 6,591,280 B2 | 7/2003 | Orr |
| 6,596,032 B2 | 7/2003 | Nojima et al. |
| 6,606,744 B1 | 8/2003 | Mikurak |
| 6,609,123 B1 | 8/2003 | Cazemier et al. |
| 6,614,433 B1 | 9/2003 | Watts |
| 6,615,247 B1 | 9/2003 | Murphy |
| 6,615,279 B1 | 9/2003 | Robinson |
| 6,623,529 B1 | 9/2003 | Lakritz |
| 6,625,805 B1 | 9/2003 | Lam et al. |
| 6,626,956 B1 | 9/2003 | Ramaley et al. |
| 6,643,663 B1 | 11/2003 | Dabney et al. |
| 6,671,387 B1 | 12/2003 | Chen et al. |
| 6,677,967 B2 | 1/2004 | Sawano et al. |
| 6,680,749 B1 | 1/2004 | Anderson et al. |
| 6,690,364 B1 | 2/2004 | Webb |
| 6,697,824 B1 | 2/2004 | Bowman-Amuah |
| 6,724,913 B1 | 4/2004 | Chen et al. |
| 6,727,928 B1 | 4/2004 | Richter |
| 6,734,873 B1 | 5/2004 | Herf et al. |
| 6,763,373 B2 | 7/2004 | Shiigi |
| 6,771,801 B1 | 8/2004 | Fisher et al. |
| 6,775,407 B1 | 8/2004 | Gindele et al. |
| 6,779,178 B1 | 8/2004 | Lloyd et al. |
| 6,785,671 B1 | 8/2004 | Bailey et al. |
| 6,792,575 B1 | 9/2004 | Samaniego et al. |
| 6,795,585 B1 | 9/2004 | Parada et al. |
| 6,803,923 B1 | 10/2004 | Hamburg |
| 6,844,885 B2 | 1/2005 | Anderson et al. |
| 6,857,102 B1 | 2/2005 | Bickmore et al. |
| 6,891,536 B2 | 5/2005 | Smith |
| 6,894,686 B2 | 5/2005 | Stamper et al. |
| 6,903,756 B1 | 6/2005 | Giannini |
| 6,909,708 B1 | 6/2005 | Krishnaswamy et al. |
| 6,912,572 B1 | 6/2005 | Fischer |
| 6,915,273 B1 | 7/2005 | Parulski |
| 6,915,484 B1 | 7/2005 | Ayers et al. |
| 6,938,073 B1 | 8/2005 | Mendhekar et al. |
| 6,940,518 B2 | 9/2005 | Minner et al. |
| 6,961,069 B2 | 11/2005 | Hashimoto |
| 6,961,905 B1 | 11/2005 | Cover et al. |
| 6,964,009 B2 | 11/2005 | Samaniego et al. |
| 6,980,668 B1 | 12/2005 | Naito et al. |
| 6,980,963 B1 | 12/2005 | Hanzek |
| 6,983,416 B1 | 1/2006 | Bae et al. |
| 7,000,195 B2 | 2/2006 | Komuro |
| 7,013,290 B2 | 3/2006 | Ananian |
| 7,016,977 B1 | 3/2006 | Dunsmoir et al. |
| 7,047,281 B1 | 5/2006 | Kausik |
| 7,050,654 B2 | 5/2006 | Lunetta et al. |
| 7,099,040 B1 | 8/2006 | Cooper et al. |
| 7,107,540 B1 | 9/2006 | Carroll |
| 7,120,634 B2 | 10/2006 | Jecha et al. |
| 7,120,860 B1 | 10/2006 | Imataki |
| 7,139,976 B2 | 11/2006 | Kausik et al. |
| 7,155,482 B2 | 12/2006 | Shinohara et al. |
| 7,159,014 B2 | 1/2007 | Kausik et al. |
| 7,177,448 B1 | 2/2007 | Sah |
| 7,188,309 B2 | 3/2007 | Simmons et al. |
| 7,191,145 B1 | 3/2007 | Lunetta et al. |
| 7,197,698 B2 | 3/2007 | Takata et al. |
| 7,236,647 B2 | 6/2007 | Lunetta et al. |
| 7,240,284 B2 | 7/2007 | Jaeger |
| 7,246,044 B2 | 7/2007 | Imamura et al. |
| 7,251,774 B2 | 7/2007 | Sunata |
| 7,263,182 B2 | 8/2007 | Allen et al. |
| 7,265,763 B2 | 9/2007 | Bossut et al. |
| 7,271,814 B2 | 9/2007 | Anwar et al. |
| 7,283,277 B2 | 10/2007 | Li |
| 7,284,201 B2 | 10/2007 | Cohen-Solal |
| 7,286,145 B2 | 10/2007 | Sunata |
| 7,302,114 B2 | 11/2007 | Lunetta et al. |
| 7,310,687 B2 | 12/2007 | Psounis et al. |
| 7,313,361 B2 | 12/2007 | Steelberg et al. |
| 7,315,659 B2 | 1/2008 | Lunetta et al. |
| 7,337,133 B1 | 2/2008 | Bezos et al. |
| 7,343,320 B1 | 3/2008 | Treyz et al. |
| 7,343,555 B2 | 3/2008 | Ko et al. |
| 7,355,608 B1 | 4/2008 | Beach |
| 7,360,159 B2 | 4/2008 | Chailleux |
| 7,366,684 B1 | 4/2008 | Douglas |
| 7,406,434 B1 | 7/2008 | Chang et al. |
| 7,447,616 B2 | 11/2008 | Wang et al. |
| 7,447,738 B1 | 11/2008 | Andrews et al. |
| 7,454,085 B2 | 11/2008 | Cazier et al. |
| 7,454,699 B2 | 11/2008 | Altman et al. |
| 7,456,993 B2 | 11/2008 | Walker, Jr. |
| 7,477,688 B1 | 1/2009 | Zhang et al. |
| 7,489,322 B2 | 2/2009 | Beach |
| 7,495,796 B2 | 2/2009 | Keane et al. |
| 7,496,554 B2 | 2/2009 | Kaplan |
| 7,506,245 B2 | 3/2009 | Jaeger |
| 7,516,183 B2 | 4/2009 | Shiigi |
| 7,516,403 B1 | 4/2009 | Fisher et al. |
| 7,523,411 B2 | 4/2009 | Carlin |
| 7,529,649 B2 | 5/2009 | Lee et al. |
| 7,562,032 B2 | 7/2009 | Abbosh et al. |
| 7,562,492 B2 | 7/2009 | Mueller |
| 7,577,901 B1 | 8/2009 | Hull et al. |
| 7,603,483 B2 | 10/2009 | Psounis et al. |
| 7,619,638 B2 | 11/2009 | Walker, Jr. et al. |
| 7,627,503 B1 | 12/2009 | Champagne et al. |
| 7,627,658 B2 | 12/2009 | Levett et al. |
| 7,631,252 B2 | 12/2009 | Hertzfeld et al. |
| 7,631,253 B2 | 12/2009 | Hertzfeld et al. |
| 7,633,510 B2 | 12/2009 | Hertzfeld |
| 7,634,175 B2 | 12/2009 | Seo et al. |
| 7,634,715 B2 | 12/2009 | Hertzfeld et al. |
| 7,673,063 B2 | 3/2010 | Xie et al. |
| 7,683,916 B2 | 3/2010 | Bossut et al. |
| 7,712,035 B2 | 5/2010 | Giannini |
| 7,725,604 B1 | 5/2010 | Levenberg |
| 7,746,358 B2 | 6/2010 | Eilers |
| 7,746,491 B2 | 6/2010 | Ikeda et al. |
| 7,769,479 B2 | 8/2010 | Iida et al. |
| 7,778,884 B2 | 8/2010 | Bamborough et al. |

(56) References Cited

U.S. PATENT DOCUMENTS

| | | |
|---|---|---|
| 7,802,014 B2 | 9/2010 | Psounis et al. |
| RE41,902 E | 10/2010 | Kaplan |
| 7,835,591 B2 | 11/2010 | Lunetta et al. |
| 7,870,012 B2 | 1/2011 | Katz et al. |
| 7,920,149 B2 | 4/2011 | Hertzfeld |
| 7,925,689 B2 | 4/2011 | Guedalia et al. |
| 7,945,855 B2 | 5/2011 | Altman et al. |
| 7,970,818 B2 | 6/2011 | Guedalia et al. |
| 8,004,584 B2 | 8/2011 | Craig et al. |
| 8,065,284 B2 | 11/2011 | Kaplan |
| 8,073,900 B2 | 12/2011 | Guedalia et al. |
| 8,161,368 B2 | 4/2012 | Hertzfeld et al. |
| 8,200,502 B2 | 6/2012 | Wedwick |
| 8,230,318 B2 | 7/2012 | Hertzfeld et al. |
| 8,233,009 B2 | 7/2012 | Hertzfeld |
| 8,245,123 B2 | 8/2012 | Hertzfeld et al. |
| 8,286,073 B2 | 10/2012 | Jaeger |
| 8,326,930 B2 | 12/2012 | Patrick et al. |
| 8,381,110 B2 | 2/2013 | Barger et al. |
| 2001/0031102 A1 | 10/2001 | Lunetta et al. |
| 2001/0056457 A1 | 12/2001 | Kikuchi et al. |
| 2002/0010794 A1 | 1/2002 | Stanbach Jr. et al. |
| 2002/0015044 A1 | 2/2002 | Edge et al. |
| 2002/0019859 A1 | 2/2002 | Watanabe |
| 2002/0026349 A1 | 2/2002 | Reilly et al. |
| 2002/0062264 A1 | 5/2002 | Knight |
| 2002/0063717 A1 | 5/2002 | Minner et al. |
| 2002/0073214 A1 | 6/2002 | Iinuma |
| 2002/0076219 A1 | 6/2002 | Uchino |
| 2002/0109737 A1 | 8/2002 | Jaeger |
| 2002/0149630 A1 | 10/2002 | Kitainik et al. |
| 2002/0152240 A1 | 10/2002 | Kitainik et al. |
| 2002/0156650 A1 | 10/2002 | Klein et al. |
| 2003/0051255 A1 | 3/2003 | Bulman et al. |
| 2003/0067560 A1 | 4/2003 | Suzuki |
| 2003/0069560 A1 | 4/2003 | Adamis et al. |
| 2003/0088609 A1 | 5/2003 | Guedalia et al. |
| 2003/0088831 A1 | 5/2003 | Bauer et al. |
| 2003/0098862 A1 | 5/2003 | Hunt et al. |
| 2003/0110211 A1 | 6/2003 | Danon |
| 2003/0113038 A1 | 6/2003 | Spencer et al. |
| 2003/0146920 A1 | 8/2003 | Tezuka et al. |
| 2003/0225568 A1 | 12/2003 | Salmonsen |
| 2004/0001106 A1 | 1/2004 | Deutscher et al. |
| 2004/0025141 A1 | 2/2004 | Nanda et al. |
| 2004/0025176 A1 | 2/2004 | Franklin et al. |
| 2004/0030719 A1 | 2/2004 | Wei |
| 2004/0062437 A1 | 4/2004 | Luo et al. |
| 2004/0133561 A1 | 7/2004 | Burke |
| 2004/0148375 A1 | 7/2004 | Levett et al. |
| 2004/0148576 A1 | 7/2004 | Matveyenko et al. |
| 2004/0169880 A1 | 9/2004 | Nakanishi et al. |
| 2004/0215525 A1 | 10/2004 | Keane et al. |
| 2004/0215719 A1 | 10/2004 | Altshuler |
| 2004/0217985 A9 | 11/2004 | Ries et al. |
| 2004/0250083 A1 | 12/2004 | Schwab |
| 2004/0258308 A1 | 12/2004 | Sadovsky et al. |
| 2004/0263640 A1 | 12/2004 | Silverbrook |
| 2005/0035944 A1 | 2/2005 | Itoh |
| 2005/0071764 A1 | 3/2005 | Jaeger |
| 2005/0078123 A1 | 4/2005 | Jaeger |
| 2005/0088684 A1 | 4/2005 | Naito et al. |
| 2005/0102629 A1 | 5/2005 | Chen et al. |
| 2005/0102630 A1 | 5/2005 | Chen et al. |
| 2005/0198567 A1 | 9/2005 | Vermeulen et al. |
| 2005/0237567 A1 | 10/2005 | Morris |
| 2005/0238251 A1 | 10/2005 | Lunetta et al. |
| 2005/0255852 A1 | 11/2005 | Steelberg et al. |
| 2005/0259883 A1 | 11/2005 | Lunetta et al. |
| 2005/0278794 A1 | 12/2005 | Leinonen et al. |
| 2006/0015580 A1 | 1/2006 | Gabriel et al. |
| 2006/0026504 A1 | 2/2006 | Balinsky |
| 2006/0031392 A1 | 2/2006 | Lunetta et al. |
| 2006/0069984 A1 | 3/2006 | Jaeger |
| 2006/0125819 A1 | 6/2006 | Hakansson |
| 2006/0127059 A1 | 6/2006 | Fanning |
| 2006/0179405 A1 | 8/2006 | Chao et al. |
| 2006/0188137 A1 | 8/2006 | Bacus et al. |
| 2006/0200761 A1 | 9/2006 | Judd et al. |
| 2006/0236254 A1 | 10/2006 | Mateescu et al. |
| 2007/0005581 A1 | 1/2007 | Arrouye et al. |
| 2007/0030506 A1 | 2/2007 | Takabayashi et al. |
| 2007/0061198 A1 | 3/2007 | Ramer et al. |
| 2007/0089053 A1 | 4/2007 | Uhlig et al. |
| 2007/0112857 A1 | 5/2007 | Guedalia |
| 2007/0136374 A1 | 6/2007 | Guedalia |
| 2007/0192210 A1 | 8/2007 | Lunetta et al. |
| 2007/0239788 A1 | 10/2007 | Cunningham et al. |
| 2007/0260979 A1 | 11/2007 | Hertzfeld et al. |
| 2008/0140705 A1 | 6/2008 | Luo |
| 2008/0155230 A1 | 6/2008 | Robbins et al. |
| 2008/0195938 A1 | 8/2008 | Tischer et al. |
| 2008/0205389 A1 | 8/2008 | Fang et al. |
| 2008/0207182 A1 | 8/2008 | Maharajh et al. |
| 2008/0225057 A1 | 9/2008 | Hertzfeld et al. |
| 2008/0225058 A1 | 9/2008 | Hertzfeld et al. |
| 2008/0275922 A1 | 11/2008 | Hertzfeld |
| 2009/0013347 A1 | 1/2009 | Ahanger et al. |
| 2009/0070485 A1 | 3/2009 | Barger et al. |
| 2009/0240569 A1 | 9/2009 | Ramer et al. |
| 2009/0254672 A1 | 10/2009 | Zhang |
| 2010/0110092 A1 | 5/2010 | Hertzfeld et al. |
| 2010/0110104 A1 | 5/2010 | Hertzfeld et al. |
| 2010/0111406 A1 | 5/2010 | Hertzfeld et al. |
| 2010/0153495 A1 | 6/2010 | Barger et al. |
| 2011/0142361 A1 | 6/2011 | Hertzfeld |

FOREIGN PATENT DOCUMENTS

| | | |
|---|---|---|
| WO | WO9808176 | 2/1998 |
| WO | WO0104840 | 1/2001 |
| WO | WO9409440 | 4/2001 |

OTHER PUBLICATIONS

Boudon et al, Interactive Design of Bonsai Tree Models, Eurographics, pp. 1-10, 2003.*

Donoghue, CoolCards: Simple Software, pp. 19-26, 1998.*

Kenneth et al, E-Commerce: Business, Technology, and Society, second edition, published by Prentice Hall, pp. 194-247, 2005.*

Belmonte, Óscar, Sergio Sancho, and José Ribelles. "Multiresolution Modeling Using Fractal Image Compression Techniques." *Journal of WSCG* 11.2 (2003): 370-378.

* cited by examiner

SYSTEM AND METHOD FOR PARAMETRIC DISPLAY OF MODULAR AESTHETIC DESIGNS

CROSS REFERENCE TO RELATED APPLICATIONS

The present application is a Continuation of U.S. patent application Ser. No. 11/969,825, filed Jan. 4, 2008, now U.S. Pat. No. 8,212,805, issued Jul. 3, 2012, which claims benefit of priority from U.S. Provisional Patent Application Ser. No. 60/883,595, filed Jan. 5, 2007, the entirety of which is expressly incorporated herein by reference.

BACKGROUND OF THE INVENTION

1. Field of Invention

This invention relates generally to parametric design software, and more particularly to systems and methods providing a human computer user interface for aesthetic design of a modular assembly.

2. Status of Prior Art

On festive occasions, such as an engagement, wedding, Bar Mitzvah, confirmation or birthday party, it is often the practice to adorn each table where the guests gather with a centerpiece in the form of a vase or bowl containing a bouquet of cut flowers. The flowers are normally distributed to only a single guest because of inherent transport limitations, e.g., that cut flowers require a vase with water. Distribution is further limited in that there is but one centerpiece typically provided per table, and also because the beauty of flowers is enhanced by their arrangement into a bouquet. Thus, if a host desires that each guest receive a party favor, a separate gift must be provided.

When the festive occasion is a birthday party for a child and many other guests are children, the tables are usually laden with candy. At the conclusion of the party, each person in attendance is given a small bag of candy as a parting gift, especially since children typically attach little value to flowers. Thus, in this case, flowers are inappropriate as a party favor, although they might still be provided as a centerpiece.

See, U.S. Pat. No. 5,683,762, expressly incorporated herein by reference.

One issue presented by such centerpiece designs described in the above patent is that there are a large number of degrees of freedom in the design. For example, a typical centerpiece has a base, 10 extending elements, each element having a candy-filled tube, an encircling spiral ribbon, a pom-pom, and a set of apical ribbons. Each element may have a different set of design parameters (e.g., colors), for the candy layers, pom-pom, encircling ribbon, and apical ribbons. The theoretical number of possibilities is in excess of billions. Given the large number of possibilities, it is difficult to envision the aesthetic effect of the color combinations without a suitable tool.

SUMMARY OF INVENTION

The present invention provides a software system which is usable for parametric display of modular aesthetic designs.

A preferred embodiment of the system comprises a client and a server. The client provides a user input for making selections of the design parameters, and a display for presenting a visual depiction of the resulting design. The server receives codes from the client, representing the parametric selections, and returns one or more files which together represent the aesthetic representation of the design.

The system is preferably interactive, that is, a user enters one parameter at a time, and the display updates in dependence thereon. Preferably, the display is a composite of a plurality of image component files, for example within a Macromedia Flash Player environment, such that a parameter change need only require updating of a portion of the files.

Advantageously, the image component files are pre-rendered for the various options, and selected by the server as required. Preferably, there are about twenty image component files which form a composite image. Further, the image component files are preferably rendered in planes, with on overlay plane obscuring portions of underlay planes.

The system may be used in conjunction with a recommender or guide, which assists a user in formulating an aesthetically pleasing result. This functionality may be implemented local to the user, at the server, or at another location.

For example, a user may define a color scheme for an event. These colors are then used to define a theme for the aesthetic design, which will generally include significant elements having corresponding colors, themes, and possibly other elements with suitably contrasting, complementary, alternating or neutral colors. In addition, these elements are automatically arranged in a suitable pattern and distribution of the color or theme elements, thereby achieving an optimal arrangement or composition as relates to contrasting, complementary or neutral colors. As a result, these elements are suitably organized in a pattern of distribution to achieve a complementary, contrasting, alternating or neutral color scheme, thereby reducing the likelihood of color discordance or color position asymmetry.

Further, the system preferably imposes various design constraints on the user to limit the scope of selections to a manageable number. For example, the maximum number of color choices presented may be less than the theoretical maximum. Likewise, arrangement of colored elements may be algorithmically determined rather than explicitly determined.

While a preferred embodiment of the invention is used for the aesthetic design of a manufactured system, a similar modular aesthetic design problem occurs in floral arrangement design (natural or artificial), and the present systems and methods can be applied to this venue as well. Thus, for example, a floral design may start with any of 10 standard baskets, having placement locations for 24 flower elements, each flower having a type, color (optional), stem length, and position. For example, for each of the 24 positions, there may be 25 different flower types, up to 12 different colors (e.g., carnations), 5 stem lengths. In theory, this leads to about 360,000 different combinations.

Another embodiment of the invention is employed for designing gift baskets. In this case, each element in the basket preferably is visible, but various basket contents have different shapes and sizes. Therefore, the basket area is divided into a grid, with some overlap possible. Each possible content is selected, with an organization optimizer to layout the contents for feasible placement in the most visually pleasing organization and spacing. In this case, a recommender may provide complementary items, such as cheese and crackers, or otherwise implement other design rules.

The present invention may also be used to model layouts of other types of manufactured items, such as cookie baskets and displays, other baked goods, fruit displays, and the like.

In some cases, the range of subcomponents is not predetermined in the system, and therefore arbitrary objects (so long as they are available in an appropriate data format) may be available for selection by a user. Thus, instead of expressly presenting all of the various options in menus and/or submenus, a search engine may be provided for use within the user interface to identify and select optional elements. In this embodiment, a user searches for elements, using words, colors, topics/classifications, or the like, and receives a menu or list of available options corresponding to the query. Typically, the response to the query will include an image of the object, and a retrieval of a record associated with a selected object will include one or more graphics files or models which are suitable for rendering, or to be rendered, within the user interface.

In some cases, the placement of the selected object within the assemblage can be contemplated, and therefore the graphics files pre-rendered for ready use. On the other hand, the assemblage may have an arbitrary shape and/or size, and the user may select various other objects, so it may be difficult to pre-render the graphic files. Therefore, a full three dimensional model of the object, or at least its exterior, is provided, which is then used as necessary to generate the images to be displayed on the user interface screen. It is noted that the user interface may itself support rendering of three dimensional models, and therefore the pre-rendering step is optional. Likewise, the search engine may be a cooperative system, providing a dedicated client-server relationship, or the client may search public search engines for the objects. Further, the search function and model acquisition may also be decoupled. For example, a user may search for objects to fill a gift basket, e.g., cheese and crackers, and may then select particular brands of cheese and crackers. After selecting these objects, a second retrieval operation may seek specific graphic or model files from a manufacturer's or distributor's website. These may be defined, for example, by SKU or other unambiguous code. The searched product subcomponent may have a readable code that classifies the item by ingredients (such as sugar free or low carbohydrate) or by size (number of ounces) or color or manufacturer, or country of origin or other characteristics that the user may deem important in searching for components to create the desired virtual representation and organization of the entire assemblage. This search engine functionality also permits an interface to various advertising subsidy systems, such as the Google Adsense® system, and further permits e-commerce integration and referrer compensation and product sponsorship revenue.

It is therefore an object of the invention to provide a method for the aesthetic design of a modular assemblage, comprising the steps of providing a client graphic user interface for receiving an input for defining parameters of the modular assemblage, and for presenting an image of the defined modular assemblage; communicating a code to a server representing the defined parameters; at the server, in dependence on the communicated code, defining a set of graphic elements corresponding to the defined modular assemblage; communicating the graphic elements from the server to the client; and displaying, at the client, the graphic elements received from the server to represent the defined modular assemblage.

It is a further object of the invention to provide a method for the design of a parametric aggregation of a plurality of different components, comprising the steps of providing a graphic user interface for receiving an input for defining parameters of the parametric aggregation, and for presenting an image of the defined parametric aggregation; in dependence on the parameters, defining a layout of a set of graphic elements representing a physical organization of the parametric aggregation; displaying the layout of the graphic elements in the graphic user interface to represent the organization of the parametric aggregation; receiving user feedback relating to acceptance of the displayed layout; and storing information defining the accepted displayed layout sufficient for physical organization of the parametric aggregation in accordance therewith.

It is a still further object of the invention to provide a method for the design of an arrangement of a plurality of different components, comprising the steps of receiving an input from a user defining a selection of the plurality of components, the defined plurality of components having associated physical attributes; arranging the plurality of components into a composition in dependence on their physical attributes and an aesthetic criteria relating to the coordinating of at least one of an appearance, predominance, and distribution of the plurality of various components; visually presenting at least one composition from a plurality of available discrete layouts to the user; selecting, by the user, one of the plurality of available discrete compositions; and generating a description of the selected composition, the description being adapted for implementation thereof as a physical composition of the plurality of components.

Another object is to provide an arrangement of a plurality of different components, designed by a method comprising the steps of receiving an input from a user describing the plurality of components, each component having associated physical attributes; proposing a composed arrangement of the plurality of components in dependence on the physical attributes of each component and an aesthetic criteria relating to a coordinating of at least one of an appearance, predominance and distribution of the plurality of components; visually presenting the proposed composition to the user; receiving at least one of a confirmation and a modification of the proposed composition from the user; and generating a description of a confirmed composition, the arrangement being physically manufactured in accordance with the description.

It is a still further object to provide a computer readable storage medium, having thereon instructions for operating a programmable device adapted to design an arrangement of a plurality of different components, by performing the steps of receiving an input from a user defining a selection of the plurality of components, the defined plurality of components having associated physical attributes; arranging the plurality of components into a composition in dependence on their physical attributes and an aesthetic criteria relating to a coordinating of at least one of an appearance, predominance and distribution of the plurality of components; visually presenting at least one composition from a plurality of available discrete compositions to the user; selecting, by the user, one of the plurality of available discrete compositions; and generating a description of the selected composition, the description being adapted for implementation thereof as a physical composition of the plurality of components. The programmable device may store a history of user input and/or a history of user interaction. The programmable device may also create a user profile associated with a specific user.

A graphic user interface may receive a user query for communication with a remote search engine. The remote search engine may respond to a user query with available parameters, such as physical parameters, for at least one component. A component may be defined by a plurality of physical parameters. For example, the components to be employed may be undefined at the initiation of a session, and the user may employ the search engine to select components. On the other hand, one or more of the components may be selected, and a search engine may be employed to provides additional components which meet certain criteria appropriate for the ensemble. The search engine may employ both functional and aesthetic criteria to select components, and in some cases, the components may be parametrically or incrementally defined, according to functional and/or aesthetic criteria. For example, color, size, weight, shape, ornamentation, type, complementarity with other components which have been selected, or will be selected, may all be employed to assist in defining the component or a set of components from which a user may ultimately select. The plurality of components may be, for example, of similar kind with respectively different parameters. In many cases, a parametric search engine query will set bounds on component parameters, and therefore the response to the query should include the actual parameters of the component or an aggregate set of components. To the extent that aesthetic features are not physical in nature, these features are also preferably returned in the query. While an image of the component may be suitable, preferably, a model or encoded set of attributes (such as an XML document) is provided, so that the ensemble can be appropriately formulated from a plurality of components.

The search engine may comprise an index of items which have not been prescreened or otherwise validated for use as components (such as a regular Internet search engine), or a may comprise a catalog of available components which have been screened or approved or selected as being appropriate. The catalog or index may further comprise images of respective components and physical parameters thereof. For example, a search query parameter may represent a visual appearance of a component, such as a color or color scheme.

The graphic user interface may comprise a user-selectable palette for interactive modification of the components. The graphic user interface may communicate through the Internet (or other suitable network) with a server, and, for example, a software construct may respond to a parametric code to generate a display of the layout of the graphic elements. Thus, for example, the display of components is generated based on a set of codes defining individual components or sets of components, preferably along with logic which may be part of the software construct which automatically arranges or aggregates the components based on a set of rules, which may be aesthetic and/or functional in nature. The software construct, for example, runs locally on a user PC, on a server communicating through a network such as the Internet, or on another system. The software construct preferably interfaces through a graphic user interface, such as Microsoft Windows of Vista, or through a web browser such as Internet Explorer 7 or Firefox.

At least one of the plurality of components may be comestible and/or perishable. Such items may have a limited shelf life. In many cases, the ensemble is prepared ad hoc, and is not intended to be an inventoried item.

The at least one composition may be automatically generated based on an aesthetic paradigm. Thus, for example, the components may be arranged, or other elements of the composition defined, based on a set of rules or an algorithm or another implicit or predefined scheme. This assists users in obtaining a composition which meets certain design rules, which may assure a desired aesthetic result or range. For example, the composition may be generated based on an automated algorithm sensitive to component color. More broadly, the composition may be generated based on an automated algorithm sensitive to at least one of: a color of at least one component, a dimension of at least one component, a temporal or spatial coordination of at least two components, a cost of at least one component, a visual relationship between at least two components, a weight of at least one component, and an availability of at least one component. With respect to dimensionality and weight, the composition may have predefined limits. For example, a container or shipping box may be predetermined, or a shipping class predefined, which sets a limit on the composition. Therefore, each element within the composition, and the aggregate set of elements, must meet the limits. On the other hand, some parameters may be aesthetically constrained. For example, certain color combinations may be preferred or undesirable. In other cases, a synchrony (relating to a temporal coordination of component system) and/or availability of elements may be considered. For example, a fresh fruit basket should generally be designed to employ concurrently available ripe fruits. Pricing and component pricing paradigm may also be relevant considerations. For example, in a fixed price arrangement, components must be selected (either individually or in the aggregate) which meet the pricing presumptions. The components and ensemble of components may have complementary attributes which are preferably considered. Thus, a selection of one component may influence the selection of another, such as cheese and crackers, or wine and wine glasses. The coordination, as discussed above, may include color, shape, size, weight, and the like.

A number of available compositions may be constrained in accordance with predetermined selection criteria. Thus, one aspect of the invention intentionally limits the available selections, and does not permit an unrestrained choice space. On the other hand, in the case of a search engine which responds to a user search engine query, which may search for items which may have been previously unknown, the choice space may be arbitrarily large.

The components are not limited to comestible or perishable goods, and for example, may include electronic devices.

BRIEF DESCRIPTION OF THE DRAWINGS

For a better understanding of the invention as well as other objects and further features thereof, reference is made to the following detailed description to be read in conjunction with the accompanying drawings, wherein.

DETAILED DESCRIPTION OF THE PREFERRED EMBODIMENTS

The decorative end closure preferably comprises a pom-pom, and more preferably a pom-pom having floral characteristics. The floral pom-pom provides an aesthetic similarity to a cut flower when attached to a hollow elongated member, and when a plurality of decorative containers arranged together provides an aesthetic substitute for a floral bouquet or centerpiece. Pom-pom decorative elements may also invoke other aesthetic significance. The pom-pom preferably has a set of apical ribbons extending therefrom, for example 6 ribbons, which may be the same or different colors.

A transparent elongated tube supports the pom-pom, and is filled with various materials, such as candy, nuts, or dried fruit, confetti, colored or flavored liquids or powders such as cosmetics, cookies, fabric, cigars, feathers and other decorative or consumable elements. The contents of the tube may be formed in layers, for example 6 layers over a one foot length. A spiral ribbon may encircle the tube. A number, for example ten, of the pom-poms are supported in a base. Each pom-pom can theoretically be different, alternating in a pattern or comprising the same color in every position, based on a number of assumptions.

The present provides software generating a human computer user interface, along with other relevant software that makes it possible to create virtual representations of a custom manufactured product over the internet or locally (in this case, a candy centerpiece), which can then be manufactured according to the exact specifications defined by the client. This "direct-from-design-to-manufacturing" process is based on a code, representing the design created by the user, which is readily translated into a design layout. For example, the code may be human readable, to permit a non-automated or semi-automated assemblage system, or a fully automated system may be implemented. When the design space is limited, preferably the limiting presumptions are applied to provide an even or distributed result. Thus, if there are ten pom-poms, the color space may be limited to 5 options, such that there are a minimum of two pom-poms of each selected color. If it is desirable to assist in assigning various colors to possible positions in the array, then the pom-poms may be automatically dispersed over the arrangement, based on a presumption that a concentration of a particular color in one location is desirable or undesirable. As the number of colors of pom-poms is increased, the arrangement is organized and reorganized to provide a proper distribution of the pom-pom colors.

Figure 1:
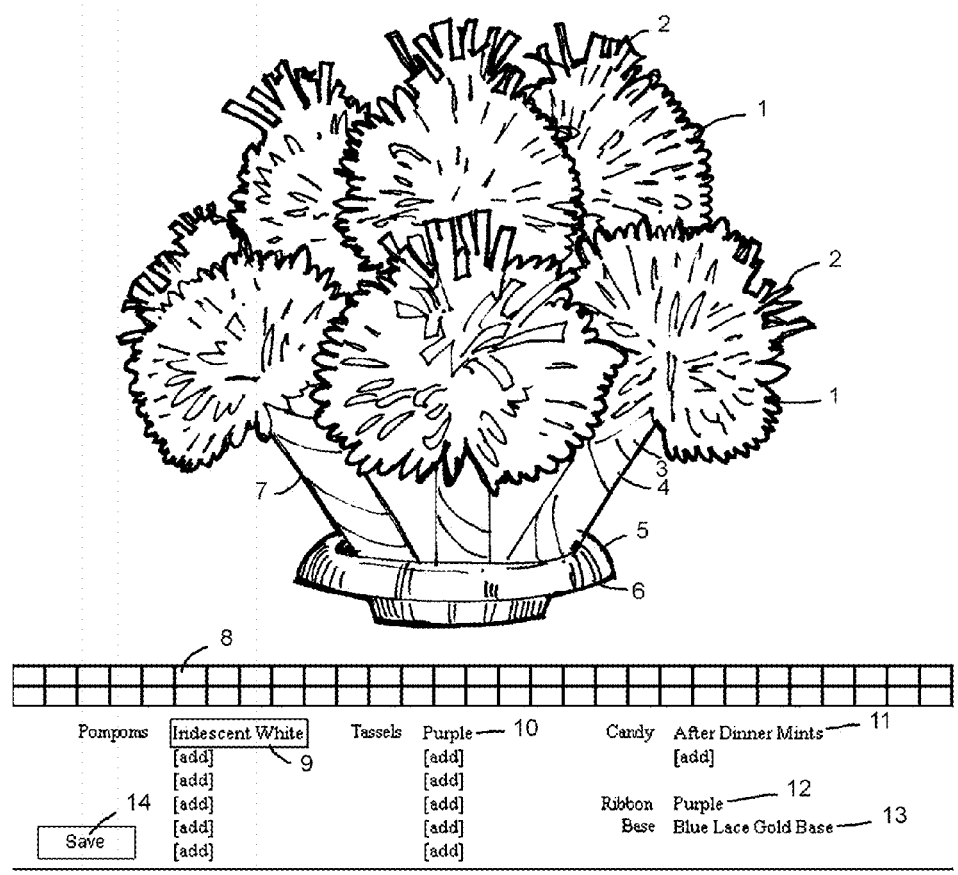
FIGS. 1-7 show various states of a client user interface screen according to a preferred embodiment of the invention.
Figure 2:
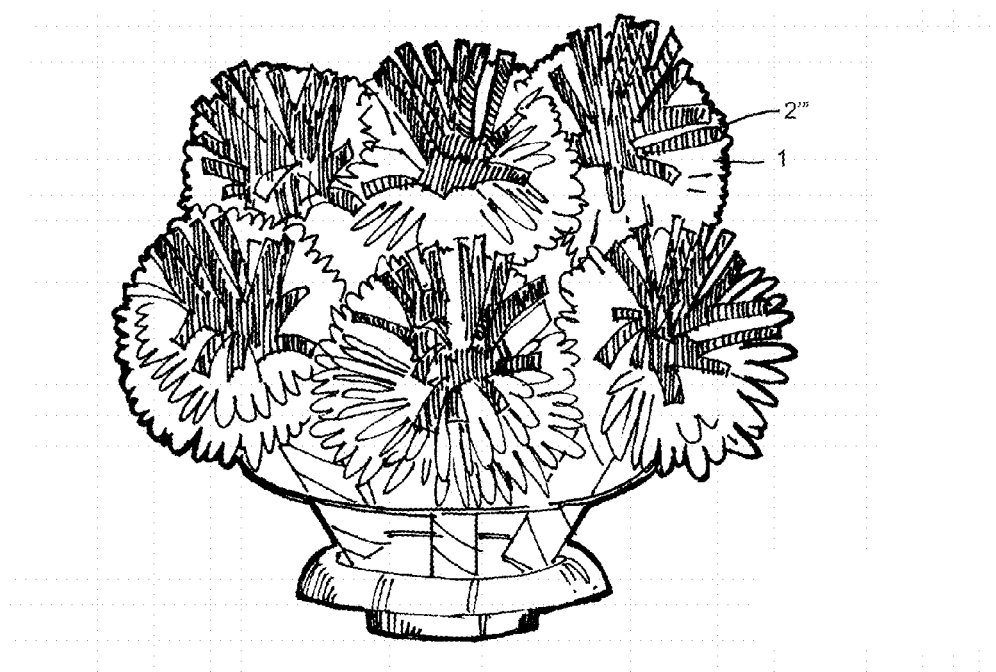
Figure 3:
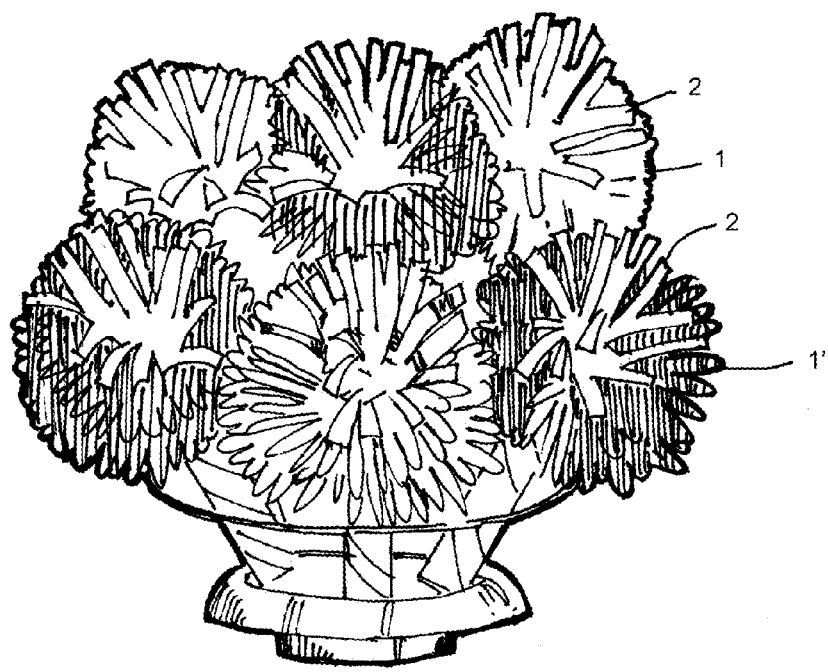

The system preferably operates using an Internet communications system, wherein a client system uses a web browser and optionally plug-in software, such as Macromedia Flash player, using a simple control panel interface that in various steps completes the design. A preferred interface is shown in FIG. 2. The client communicates with a server system. Exemplary code for the server software is provided in a source code appendix, attached hereto and expressly incorporated herein by reference. The server architecture is represented in FIG. 1.

A preferred architecture for the product to be designed, and the graphic representations thereof, breaks the product down into sufficient components and subcomponents to actually make it a custom-made product, and not just a selection from a few standard options. If there are only five options total, a parametric design system is superfluous.

A preferred "design tool" has a control panel with colored buttons that allow the user to select different colors for different sub components. The result is a centerpiece completely customized, with permutations calculated to be beyond quadrillions in number.

The preferred system supports the adding of color on a subcomponent basis, which includes increasing the frequency of subcomponents with certain colors or decreasing the frequency of subcomponents of another color in distributed patterns of contrasting, complementary, neutral or, alternating colors, or colors selected by the user according to their own preference. In addition to increasing or decreasing frequency of elements with a certain color, different subcomponent elements may be spatially repositioned to more realistically create a balance of colors. In other words, if we want to add more black pom-poms to the bouquet, the program knows, aesthetically speaking, to organize the black pom-poms in a random looking array so that all the black pom-poms are not just on one side of the bouquet. This has applications in virtual flower arranging and gift basket arranging as well.

The system supports online designing products from "scratch," e.g., assembling components and subcomponents into a complete unit to the customer's liking. In order to properly represent the assemblage, a three dimensional model representation of each element or sub-element is provided, often achieved by automated rendering software. One of the requirements of this three dimensional model is that it visually represent what each subcomponent would look like if it were placed in different x, y and z coordinates in the arrangement (array). All these possible positions would be modeled and a file would have to be made for each component in each position in every possible color to have maximum design possibilities. This leads to the creation of hundreds, or even thousands of colored and spatially positioned subcomponent files. Of course, it is also possible to render the components or the entirety in real time, but this approach is computationally expensive, and difficult to scale. That is, the number of simultaneous users would be substantially limited. In contrast, the pre-rendered component files are readily called through a server file system, based on a translation of the arrangement code received from the client software, thus potentially supporting a large number of simultaneous users and also minimizing the download time.

It is noted that, in some cases, it may be desirable to communicate a three dimensional model to the client, including each component. This architecture permits client-side rendering of various views and lighting conditions.

Each image of every component in possible positions is assigned to a graphic file, such as a ".png" file, which allows sufficient transparency or opacity properties that layers can be built up from the components. These layers have to be mapped to make sure that files representing the objects closest to the viewer are on top of the layers further away.

A control panel is provided to manipulate these layers of subcomponent image files in accordance with algorithms that define the aesthetic of the end product. For example, in a preferred embodiment, when the client requests to have two different color pom-poms, the program reorganizes the pom-poms accordingly to a distributed pattern. When a third color pom-pom is added to the mix, such as in a red, white and blue bouquet, then the pom-poms are again reorganized. And when a fourth color pom-pom is added, once more all the pom-pom colors for each position are reorganized again to reflect a predetermined parameter of color balance that is desirable. Alternatively, the system could be requested to allow more user control over exact positioning.

Using similar principles to design a virtual gift basket, we take into consideration the three dimensional special requirements of each product in the gift basket as well as the optimal aesthetic look—should all the tall items be on one side of the basket or should they be arrayed according to some other principle?

The system also preferably calculates which type and class of subcomponents are added and how that will affect cost, shipping, weight, etc. The design software therefore preferably interfaces with e-commerce software, to facilitate cost estimation and ordering.

Another possible feature of the preset system provides subcomponents which are of sufficient granularity to allow for the user to achieve gradual changes as opposed to visually sudden graphic color changes. This kind of control is referred to as color blending or subcomponent feature accrual when applied to shape and size of the composited component. According to an embodiment of the present invention, the end user is provided with color blending control, which means that by manipulating subcomponents the user can affect gradation of color changes as opposed to a discrete color choice. Advantageously, the user may be provided with a user interface element which acts like an analog control for example a slider or knob, to adjust the value(s), which are then interpreted by the system to define the blending, length or size. The interpretation of the input control need not be linear, and therefore logical elements may be provided to assist the user in formulating aesthetically pleasing results while reducing the interface complexity and decision-making complexity.

The method according to a preferred embodiment of the invention is as follows:

Subcomponents are identified that can vary by pattern of color, shape, position, composition, mixing, blending, timing, quantity and other factors that can be distributed in a pattern that affects the overall product appearance, shape, composition, and other factors. For example, pom-poms can be arranged in any available color in any of several defined positions. Initially, all the pom-pom subcomponent elements may be presented in the same color or some other initial state as defined by the system such as a default color composition or a saved version of the user's choice. Additional color pom-poms can be introduced, and the system will have to accommodate this new color into the pattern. Similarly, if one or more pom-pom colors are introduced, the system must accommodate those added colors in a new pattern that takes into account the design logic that is defined for the aggregated product.

Patterns can also be created by breaking down a sub element, like tassels (e.g., apical ribbons), into component parts which are combined together to produce the desired overall affect in the subcomponent. In order to simplify the user interface, and to impose design constraints, some aspects of the design are constrained by the system, for example in a manner designed to achieve an aesthetically pleasing result. For example, an even distribution of elements throughout an arrangement may be preferred over one which is asymmetric or polarized.

In this way, all like subcomponents (e.g., tassels combinations) can be created from combining layers of subcomponent elements which create a composite. For example, each tassel subcomponent element can specified for a specific color. There are six separate subcomponent tassel elements that comprise the entire tassel assembly. By layering into multiple subcomponents that are composite, a degree of color control that is referred to as color blending.

For example, all six layers can be royal blue. Or if we wish to introduce a splash of white, we can choose to make one of the layers as white. And then if we want more white, we can change another of the six blue layers white. Such a system requires a way of changing one subcomponent element at a time.

A feature is provided that allows all the subcomponent elements to be set or reset at once to a particular color or feature, as well as being able to fine tune the composite by selecting individual layers for change, for example, features such as color, shape, position, quantity etc., may be set or reset.

The patterns are affected by the distribution and balance of colors as different color pom-poms or subcomponent elements are added to the mix. The overall appearance of the aggregated product is affected by changes in subcomponent patterns. Separate subcomponents are placed in different layers, facilitating their rendering and display through the graphic user interface. For example, 8-12 layers may be provided for pom-poms; one layer for each position. Each layer is populated by a graphic component file, selected from ones rendered in a particular color, and specific for a particular position in the arrangement.

Subcomponents are separated into small subcomponent elements, where possible, to create even more variability in the final aggregated product.

For example, the preferred embodiment provides a formula of 36 subcomponent tassel elements, six in each layer. The finer the definition, the more control over the final aggregated product.

For the candy, a maximum of two colors per tube was imposed as a limitation. These include bottom layer candies, top layer candies and tubes with candies of all one type. It is also possible to mix the candies, rather than to layer them.

A projection of a three dimensional model of each subcomponent, rendered in each color option and position, is created and stored. The server software selects appropriate stored files for communication to the client. Images files may have transparent or semitransparent portions, and employ image formats such as ".png".

The stored files have an encoded filename, allowing the server to specify the desired files by their parametrically encoded filenames.

The client defines an arrangement by way of a code, which defines every selected option. Preferably, this code is human-readable, and employs 1-3 characters to represent every attribute. Blank attributes are indicated by "X"s. The code, in addition to being usable by the server to define the image components, may also be used to define the manufacturing parameters, and by an e-commerce engine to permit pricing and ordering.

Various logic modules may be designed for organizing, reorganizing, positioning, and repositioning subcomponent or subcomponent elements into an arrangement of layers that adhere to the design instructions of the user through the interface, as well as possibly organizing, reorganizing, position and repositioning subcomponents and subcomponent elements according to a predefined logic that optimizes characteristics important to the final aggregated product such as color balance or color harmony, relative position of subcomponents, and minimization of aesthetic or positional or other conflicts between elements that can occur when no logic is applied.

A database of arrays is created for holding subcomponent and subcomponent element files for the purpose of being manipulated by the design logic modules. The database remembers what was created by a user, so that changes can be saved. If desirable, a system of having a user login and password is implemented whereby the server can record the status of a user session. User attributes such as name, email address, name of design or other user or design information are thus enabled. Likewise, a method of tracking designs, design updates and changes, and designer activity is also enabled. A system of administering the various users may be implemented whereby an administrator can allow or disallow access to the system, or various features thereof, by users according to date, class of user, such as a party planner or end user or other parameters made available to the administrator. In addition, such an administrative tool can allow the administrator to manage user accounts, view designs created by users, record or monitor changes, customer orders, updates, patterns of use, and other tools to enable an administrator to comprehensively oversee and monitor system usage. This tool further permits pricing and discounts to be dependent on a user identity or classification.

The system can also be enabled to communicate with an inventory-type database that can automatically advise the server as to which component or subcomponent color elements are currently available. In the preferred embodiment, the component or subcomponent elements which are not available are removed from the menu or color selections available to the user in the interface. Likewise, if certain combinations are already in inventory, these may be differentially priced as "catalog" instead of "custom".

The system permits calculation of costs, availability, production time and other factors relevant to the production and purchasing of the assembled product. The information may be efficiently communicated to a factory, assembly area or warehouse, to facilitate manufacturing and coordinate between the various centers within the production process.

FIGS. 1-7 show an arrangement of components in a base. Each component includes subcomponents, which comprises a pompom 1, having tassels 2, supported by a tube 7, containing candy 8, encircled with a ribbon 4. The base 5 may also be decorated 6, and supports the components in a predefined arrangement. A graphic user interface is represented in the bottom of FIGS. 1-7. A color palette 8 provides color choices. For example, a user selects a pompom 1 color 9, a tassel 2 color 10, a candy 3 type and color 11, a ribbon 4 color 12, and a base decoration 13. The pompom 1, tassel 2, and candy 11 can each have multiple concurrent selections. For example, the tassels 2', 2", and 2''' (shown in FIG. 6) are each a different color. After selecting a feature and a respective attribute, the user selects the "save" function 14, which transmits a code to a remote server representing the selection. In some embodiments, a map function may be employed which is remotely interpreted to indicate the location of the user interaction with a graphic.

FIG. 1 refers to an arrangement of the plurality of the components and their constituent subcomponents in an initial state presentation of the composition. The initial state can be defined by at least one of: user attributes, user preferences, aesthetic paradigms and physical attributes. Once an initial state is presented, the plurality of components can be re-ordered globally using a palette based design system. The user selects a feature from the graphic user interface, and an attribute. For example, in FIG. 2, the user selected purple tassels 2''' on an iridescent white pompom 1, and since these were singular selections, all of the pompoms and tassels have the same color scheme. With these selections, the attributes of the other features remain constant. Subcomponents, such as the pompoms 1, 1' can be automatically re-positioned in the composition, such as in FIG. 3, based on sensitivity to color where the pompoms 1, 1' are distributed spatially and visually according to an aesthetic paradigm. Distribution can also be sensitive to, for example, size, price, weight, synchrony, balance and other physical and visual attributes.

Figure 4:
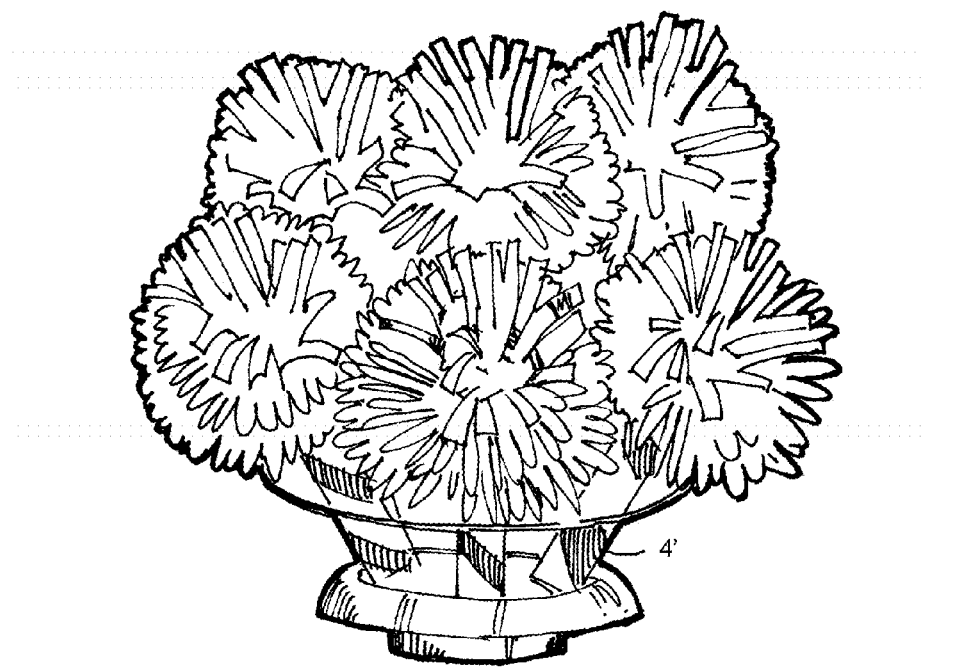
Figure 5:
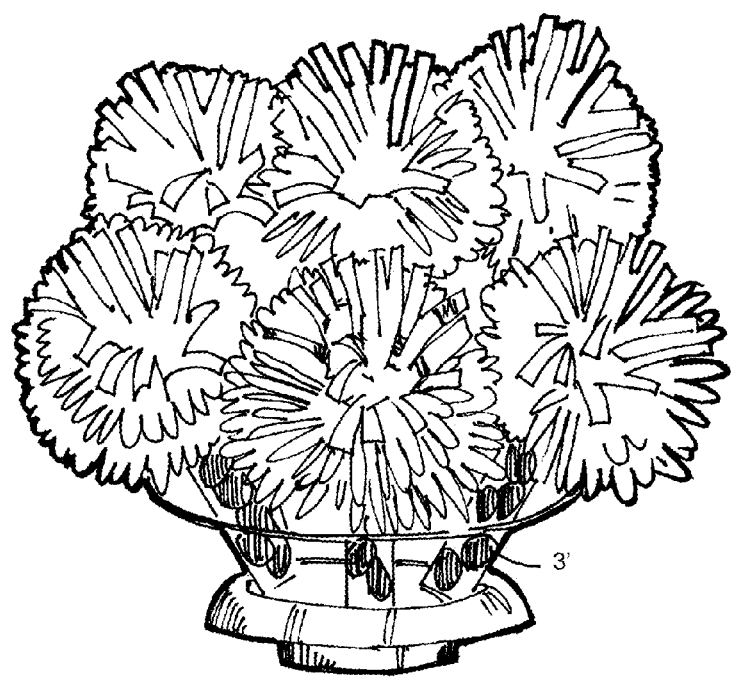

Of the plurality of components, some categories of components can be coordinated by a class of features, such as ribbons 4 as referred to in FIG. 4 or in concert with other classes of components such as the tassels. The plurality of components may contain, as one of their elements, comestible items such as candy 3', which as shown in FIG. 5 are after dinner mints 11, that can be defined and arranged parametrically, for example based on type and color combinations. In this example, more than one comestible item may be combined together to create unique blended combinations. The combinations can be replicated globally throughout similar tubular components as shown.

The entire composition can be arranged based on a presentation context such as a theme or overall packaging, unifying packaging and containers can be organized based on preference from the selectable palate. The base 5 element is selectable based on its color or decoration 13. It can also be adapted automatically according to contextual information such as room presentation.

Figure 6:
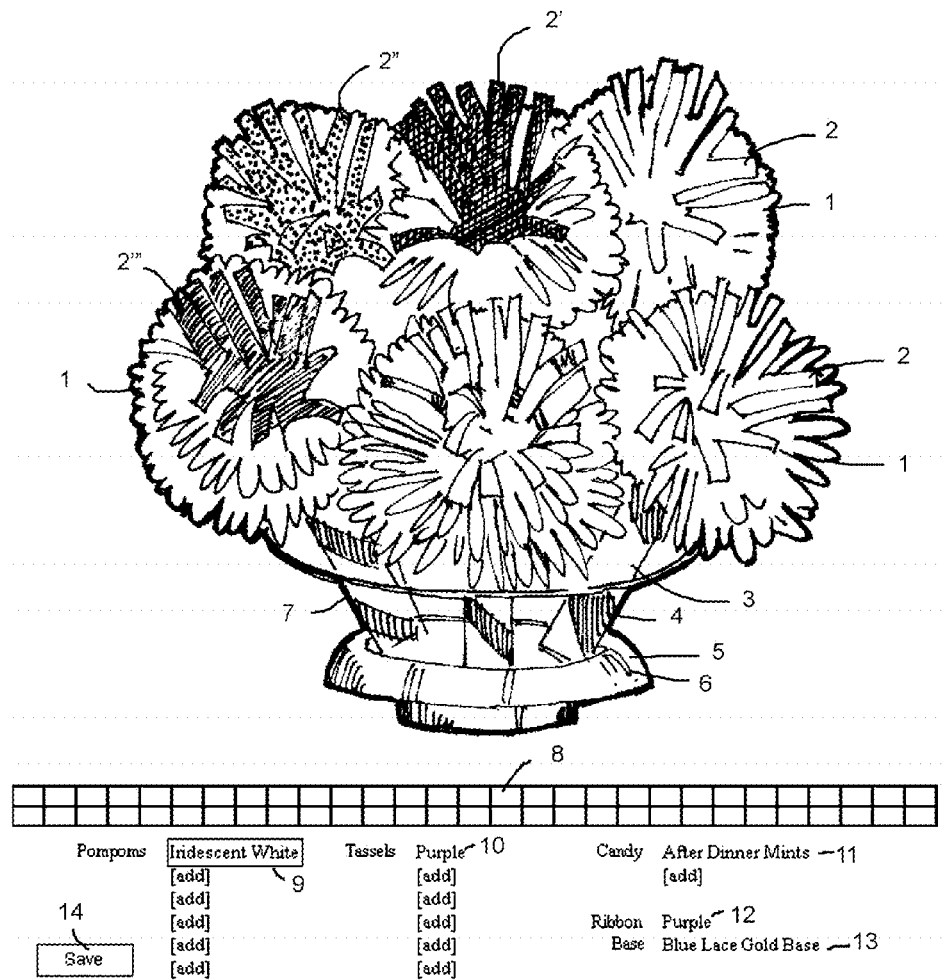
Figure 7:
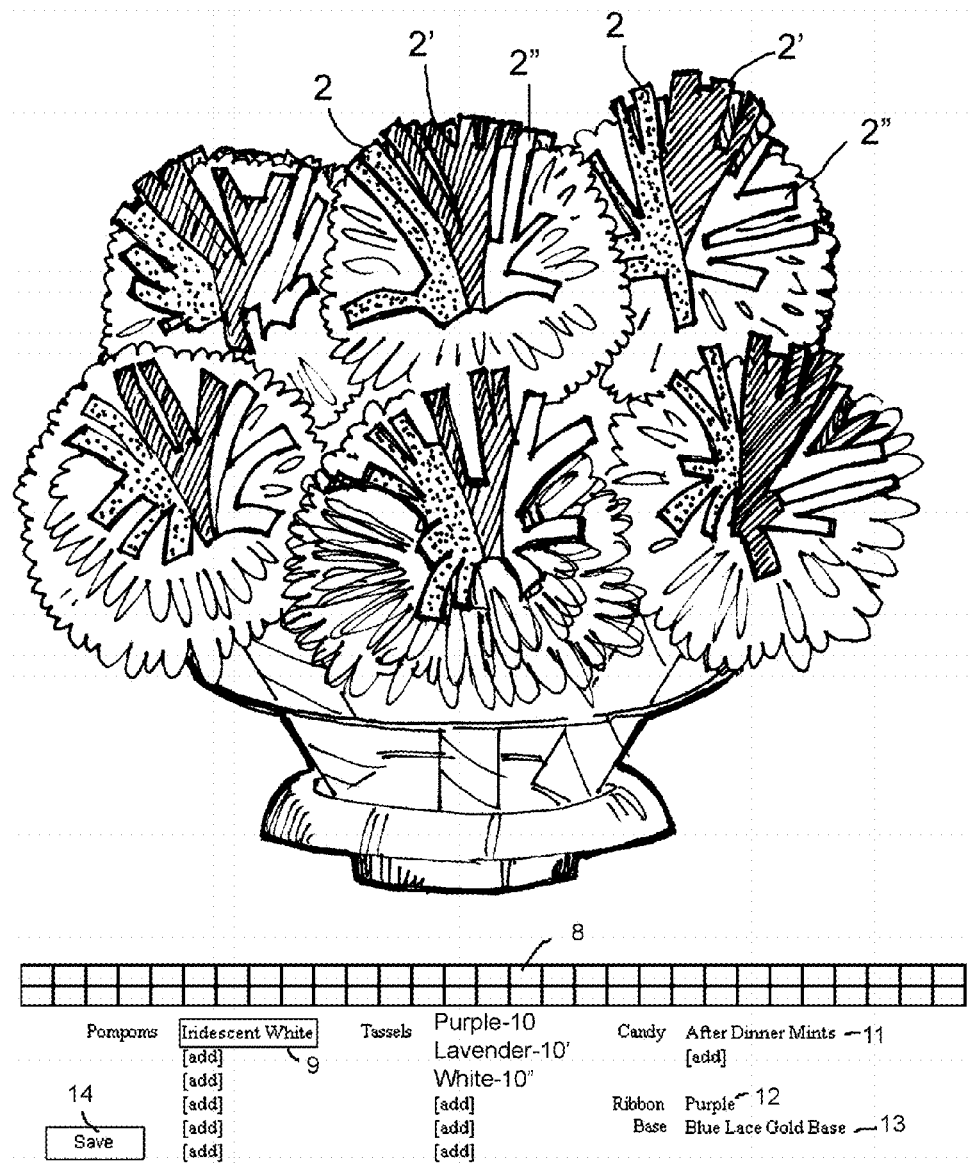
Figure 8:
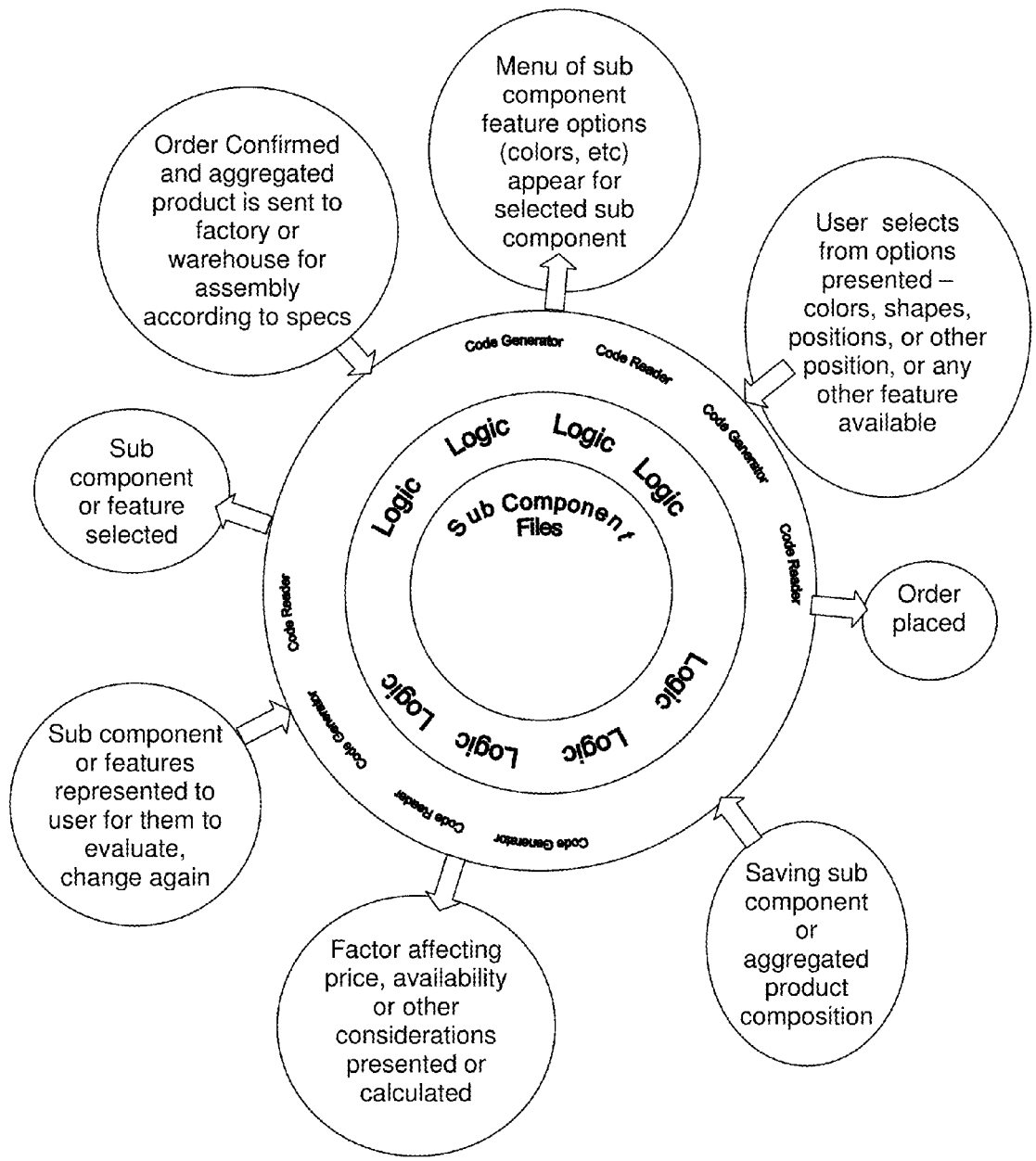
FIG. 8 shows a schematic diagram of a preferred embodiment of the system.

The parametric arrangement of the plurality of components may be coordinated according to the appearance, predominance and distribution of the components. The tassel 2', 2", 2''', features of different instances of a respective component, as shown in FIG. 6, may concurrently have a plurality of different colors, or a single instance of a respective component 2', 2", 2''' may have a plurality of colors 10, 10', 10", as shown in FIG. 7, based on different selectable colors sensitive to color pre-dominance for creating a blended color composition. Based on an automated arrangement algorithm, each component may be different from the others, or there may be sets of components of differing types.

While there have been shown and described preferred embodiments of a centerpiece assembly simulating floral bouquet in accordance with the invention, it will be appreciated that many changes and modifications may be made therein without, however, departing from the essential spirit thereof.

What is claimed is:

1. A method for designing a parametric aggregation of components, comprising:
    (a) receiving, from a user through an automated browser, a first user input defining aesthetic characteristics of a plurality of components, comprising at least two different non-shape and non-size attributes, and at least one additional parameter for each component;
    (b) automatically generating, by an automated server, based on at least the received first user input, a first data set representing a first distribution of the user input-defined aesthetic characteristics of the components within an aggregation of components, the aesthetic characteristics of the components being automatically distributed according to an aesthetic design algorithm implementing an aesthetic paradigm representing three dimensions, responsive to the at least one additional parameter and at least a complementarity of the at least two different non-shape and non-size attributes;
    (c) presenting to the user through the automated browser, the first distribution of the aggregation of components;
    (d) receiving, from the user, through the automated browser, a second user input representing a user-desired change in the at least one additional parameter;
    (e) automatically generating, by the automated server, a second data set representing a second distribution of the aesthetic characteristics of the components according to the aesthetic design algorithm, responsive to at least the complementarity of the at least two different non-shape and non-size attributes, the first user input and the second user input representing the change in the at least one additional parameter, wherein the second distribution is different from the first distribution; and
    (f) presenting to the user through the automated browser, the second distribution of the aggregation of components including the at least two different non-shape and non-size attributes.

2. The method according to claim 1, wherein the automated browser comprises a web browser, the automated server comprises a web server, and the first distribution and the second distribution are each communicated to plug-in software associated with the web browser as respective sets of parameters, which are processed by the plug-in software and the web browser to generate the image, selectively dependent on the set of parameters.

3. The method according to claim 1, further comprising automatically defining a search query based on at least the first user input received through the automated browser and automatically querying an Internet search engine from the automated server, and receiving from the Internet search engine by the automated server a set of parameters representing the characteristics of at least one of the plurality of components, wherein the Internet search engine is distinct from the automated server.

4. The method according to claim 3, wherein the Internet search engine searches an index of items which have not been prescreened or otherwise validated for use as components.

5. The method according to claim 1, wherein the characteristics of a plurality of components, having at least two different non-shape and non-size attributes, comprise at least two different colors associated with components of the same type.

6. The method according to claim 1, further comprising automatically selecting at least one characteristic by the automated server in response to the first user input received through the automated browser.

7. The method according to claim 1, wherein the automated browser presents a user-selectable color for interactive modification of a selection of respective color of respective components.

8. The method according to claim 1, wherein the automated browser has at least one plug-in which responds to a set of parameters received from the automated server, for defining non-shape and non-size attributes of respective components of the parametric aggregation of components, further comprising automatically displaying the image responsive to the received set of parameters by the automated browser.

9. A method for designing a representation of an aggregation, comprising:
(a) receiving, through a communication network, an input from an interface defining at least two different non-shape and non-size sensory attributes of components within an aggregation of components;
(b) automatically generating, by an automated processor, a distribution of the aggregation of components according to an aesthetic paradigm, responsive to at least a complementarity of the defined at least two different non-shape and non-size sensory attributes of the components;
(c) automatically communicating sets of parameters representing a distribution of non-shape and non-size sensory attributes of each respective component of the aggregation of components through the communication network to the interface; and
(d) automatically communicating modified sets of parameters representing the distribution of non-shape and non-size sensory attributes of each respective component of the aggregation of components through the communication network to the interface, in response to a further input from the interface, representing at least one change in the at least two different non-shape and non-size sensory attributes of the components, and presenting of the aggregation of components.

10. The method according to claim 9, further comprising receiving from an Internet search engine by the automated processor, through a distinct communication channel from the interface, a set of parameters representing non-shape and non-size sensory attributes of the respective components.

11. The method according to claim 9, further comprising receiving from an Internet search engine at least one image of a component in response to a user query communicated through the interface and the automated processor, receiving from the user a selection of the at least one image as a representation of the non-shape and non-size sensory attribute of the respective component, and including the respective component in the selected at least one image in the aggregation of components.

12. The method according to claim 9, wherein the plurality of components comprise at least two different types, each type being independent of the non-shape and non-size sensory attributes, wherein the aesthetic paradigm is responsive to a complementarity of both the different non-shape and non-size sensory attributes and a complementarity of the different types.

13. The method according to claim 9, wherein the non-shape and non-size sensory attributes comprise colors, further comprising automatically selecting by the automated processor at least one color non-shape and non-size sensory attribute responsive to and in addition to the at least two received color non-shape and non-size sensory attributes, and presenting in the aggregation of components, at least one component having the automatically selected at least one color non-shape and non-size sensory attribute.

14. The method according to claim 9, further comprising:
automatically defining a search query based on at least the input received through an automated browser;
automatically querying an Internet search engine by the automated processor, wherein the Internet search engine is distinct from the automated processor and the Internet search engine searches an index of items which have not been prescreened or otherwise validated for use as components; and
receiving from the Internet search engine by the automated processor a set of parameters representing the sensory attributes of components.

15. A method for composing a parametric design, comprising:
(a) receiving an input from a user interface through a communication port defining a state of at least two color characteristics of an aggregation of components and at least one additional characteristic;
(b) generating an optimized distribution of the aggregation of components using an automated processor remote from the user interface, according to aesthetic criteria comprising at least:
(i) a complementarity of the at least two color characteristics; and
(ii) a distribution symmetry factor, responsive to at least the defined state of the at least two color characteristics and the at least one additional characteristic of the aggregation of components; and
(c) representing the characteristics of each respective component of the aggregation of components, and the distribution of the aggregation of components as a set of parameters stored in a memory.

16. The method according to claim 15, wherein the received input defining the state of the at least one additional characteristic is received from an Internet search engine based on an automatically generated query.

17. The method according to claim 16, further comprising automatically generating and communicating a query to an Internet search engine, wherein the Internet search engine searches an index of available components, and communicates at least one image and at least one physical parameter of the respective component, the automated processor receiving the at least one image and the at least one physical parameter and including the respective component defined according to the at least one image and the at least one physical parameter in the optimized distribution of components.

18. The method according to claim 15, wherein the at least one additional characteristic comprises a content associated with a respective component.

19. The method according to claim 15, wherein the set of parameters are processed by an Internet browser to present a color image to a user.

20. The method according to claim 15, further comprising interactively modifying the aggregation of components or a distribution of the aggregation of components based on user inputs received through an interactive user interface of a browser, communicated to a remote Internet server.

21. The method according to claim 15, further comprising providing an automated recommender to a user for automatically determining and providing complementary items to a received user selection.

22. A method for composing a parametric aggregation, comprising:
receiving an input defining parametric characteristics of a plurality of separable and independent components or subcomponents, each representing a physical characteristic which permissibly varies over a range of a parameter comprising at least three distinct values, at least one parametric characteristic being a characteristic exclusive of shape and size;
automatically generating a representation of a distribution of the plurality of components or subcomponents having at least two different values of the parametric characteristics comprising the characteristic exclusive of shape and size, distributed according to a design logic responsive to at least perceptual differences between respective different values of the respective parametric characteristics comprising the characteristic exclusive of shape and size of the plurality of components or subcomponents; and
representing the parametric characteristics, and the model of the aggregation as a set of values stored in a memory.

23. The method according to claim 22, further comprising:
receiving an input from a user which alters at least a number or proportion of respective components or subcomponents having different characteristics exclusive of shape and size;
automatically regenerating a representation of a distribution of components or subcomponents having the altered number or proportion, distributed according to the design logic, responsive to at least the perceptual differences; and
representing the parametric characteristics, and the model of the regenerated aggregation as a set of values stored in the memory.

24. The method according to claim 22, wherein the at least one parametric characteristic comprises an aesthetic characteristic exclusive of shape and size, and the design logic implements an aesthetic theme.

* * * * *